(12) United States Patent
Nakagawa et al.

(10) Patent No.: US 8,786,379 B2
(45) Date of Patent: Jul. 22, 2014

(54) COMMON MODE NOISE FILTER

(75) Inventors: Takashi Nakagawa, Tokyo (JP); Takeshi Okumura, Tokyo (JP); Toshio Tomonari, Tokyo (JP)

(73) Assignee: TDK Corporation, Tokyo (JP)

( * ) Notice: Subject to any disclaimer, the term of this patent is extended or adjusted under 35 U.S.C. 154(b) by 412 days.

(21) Appl. No.: 13/108,567

(22) Filed: May 16, 2011

(65) Prior Publication Data

US 2011/0285477 A1    Nov. 24, 2011

(30) Foreign Application Priority Data

May 21, 2010    (JP) ................................. 2010-117694

(51) Int. Cl.
*H04B 3/28* (2006.01)
*H02H 7/09* (2006.01)
*H03H 7/09* (2006.01)
*H03H 1/00* (2006.01)

(52) U.S. Cl.
CPC . *H04B 3/28* (2013.01); *H03H 7/09* (2013.01); *H03H 2001/0085* (2013.01)
USPC .............................. 333/12; 333/181; 333/185

(58) Field of Classification Search
CPC ..... H03H 7/09; H03H 2001/0085; H04B 3/28
USPC ................... 333/12, 167, 181, 185, 175, 165; 336/200
See application file for complete search history.

(56) References Cited

U.S. PATENT DOCUMENTS

| | | | |
|---|---|---|---|
| 5,039,964 A | * | 8/1991 | Ikeda ............................ 333/181 |
| 7,692,527 B2 | | 4/2010 | Ito et al. |
| 2007/0252659 A1 | * | 11/2007 | Suenaga et al. ................. 333/32 |

FOREIGN PATENT DOCUMENTS

| | | |
|---|---|---|
| JP | 08-203737 | 8/1996 |
| JP | 2007-103475 | 4/2007 |
| JP | 2007-103477 | 4/2007 |
| JP | 2007-129291 | 5/2007 |
| JP | 2008-288505 | 11/2008 |

* cited by examiner

*Primary Examiner* — Benny Lee
*Assistant Examiner* — Rakesh Patel
(74) *Attorney, Agent, or Firm* — McDermott Will & Emery LLP

(57) ABSTRACT

A common mode noise filter includes: a common mode filter inserted into a pair of signal lines; and a pair of capacitively coupled coils having one ends connected respectively to the corresponding signal lines and the other ends opened. According to the present invention, common mode noise can be removed by a common mode filter, as well as, differential mode noise in a desired frequency band can be removed by a pair of coils whose other ends are opened.

19 Claims, 17 Drawing Sheets

COMMON MODE NOISE FILTER

BACKGROUND OF THE INVENTION

1. Field of the Invention

The present invention relates to a common mode noise filter and, more particularly, to a common mode noise filter capable of attenuating not only common mode noise but also differential mode noise in a specified frequency band.

2. Description of Related Art

In recent years, USB 2.0 standard or IEEE1394 standard has been widely spread as a high-speed signal transmission interface and is now used in various kinds of digital devices such as a personal computer and a digital camera. Such an interface adopts a differential transmission system that transmits a differential signal using a pair of signal lines and realizes higher-speed signal transmission than a conventional single-end transmission system.

As a filter for removing noise on a high-speed differential transmission channel, a common mode filter is often used (refer to Japanese Patent Application Laid-Open No. H8-203737). The common mode filter has low impedance for a differential component of signals transmitted through a pair of signal lines and has high impedance for an in-phase (common mode) component. Therefore, by inserting the common mode filter into a pair of signal lines, it is possible to cut common mode noise without substantially attenuating the differential mode signal.

As described above, the common mode filter has low impedance for the differential component and thus hardly attenuates a required signal component. However, the differential component sometimes includes unnecessary differential mode noise aside from the required signal component. Such unnecessary differential mode noise is hardly removed by a conventional common mode filter. Thus, the insertion of a common mode filter into a pair of signal lines may be insufficient for noise reduction. In particular, when a signal line in a mobile phone serves as a generation source of the differential mode noise, communication sensitivity may degrade.

SUMMARY

An object of the present invention is therefore to provide a common mode noise filter capable of attenuating not only common mode noise but also differential mode noise in a specified frequency band.

According to one aspect of the present invention, there is provided a common mode noise filter including: a common mode filter inserted into a pair of signal lines; and a pair of capacitively coupled coils having one ends connected respectively to the corresponding signal lines and the other ends opened.

According to the present invention, common mode noise can be removed by a common mode filter, as well as, differential mode noise in a desired frequency band can be removed by a pair of coils whose one ends are opened.

In the present invention, a configuration may be adopted in which the pair of coils are formed in a single component, and common mode filter and the pair of coils are formed respectively in different components. With this arrangement, it is possible to remove differential mode noise in a desired frequency band without modification to an existing common mode filter.

In the present invention, the common mode filter and the pair of coils may be formed in a single component. With this arrangement, it is possible to remove the common mode noise and differential mode noise in a specified frequency band by the single component.

According to another aspect of the present invention, there is provided a common mode noise filter including: a substrate; magnetically coupled first and second coils provided on the substrate; and capacitively coupled third and fourth coils provided on the substrate, the third coil having one end connected to one end of the first coil and the other end opened, and the fourth coil having one end connected to one end of the second coil paired with the one end of the first coil and the other end opened.

According to the present invention, it is possible to remove the common mode noise and differential mode noise in a specified frequency band by a single component. In addition, a configuration in which coils are mounted one by one on a substrate is adopted, so that a common mode noise filter suitable for surface mounting can be provided.

In the present invention, the third and fourth coils are preferably magnetically coupled to each other. With this arrangement, differential mode noise in a relatively low frequency band can be removed.

In the present invention, it is possible to adopt a configuration in which a winding direction from the one end of the third coil to the other end thereof as viewed from one direction is the same as a winding direction from the one end of the fourth coil to the other end thereof as viewed from the one direction. With this arrangement, differential mode noise in a relatively low frequency band can be removed.

In the present invention, it is possible to adopt a configuration in which a winding direction from the one end of the third coil to the other end thereof as viewed from one direction is opposite to a winding direction from the one end of the fourth coil to the other end thereof as viewed from the one direction. With this arrangement, differential mode noise in a relatively high frequency band can be removed.

In the present invention, it is possible to adopt a configuration in which the one ends of the third and fourth coils are each one of an inner circumferential end and an outer circumferential end, and the other ends of the third and fourth coils are each the other one of the inner circumferential end and the outer circumferential end. With this arrangement, the structures of the third and fourth coils can be made substantially the same as each other, facilitating adjustment of magnetic coupling and capacitive coupling between them.

In the present invention, it is possible to adopt a configuration in which the one end of the third coil and the other end of the fourth coil are each one of the inner circumferential end and the outer circumferential end, and the other end of the third coil and the one end of the fourth coil are each one of the inner circumferential end and outer circumferential end. With this arrangement, the degree of design freedom can be enhanced.

In the present invention, the third and fourth coils may overlap each other as viewed in a direction perpendicular to a main surface of the substrate. With this arrangement, comparatively large capacitive coupling can be obtained.

In the present invention, it is preferable that the first and third coils are formed in a first wiring layer provided on the substrate and that the second and fourth coils are formed in a second wiring layer provided on the substrate. With this arrangement, the number of wiring layers is equal to that of a typical common mode filter, thus preventing an increase in production cost and allowing achievement of a reduction in the height of a product.

In the present invention, the first to fourth coils may be formed respectively in first to fourth wiring layers provided on the substrate. With this arrangement, it is possible to reduce the planar size of the component. Further, when a magnetic body is disposed between the first and second coils constituting the common mode filter and third and fourth coils constituting the differential mode filter, the magnetic interference between the filters can be reduced.

The common mode noise filter according to the present invention further includes capacitively coupled fifth and sixth coils provided on the substrate, wherein the fifth coil has one end connected to the one end or the other end of the first coil and the other end opened, and the sixth coil has one end connected to the one end or the other end of the second coil and the other end opened. With this arrangement, it is possible to enhance differential mode noise removal characteristics.

As described above, according to the common mode noise filter of the present invention, it is possible to remove not only common mode noise but also differential mode noise in a desired frequency band.

BRIEF DESCRIPTION OF THE DRAWINGS

The above features and advantages of the present invention will be more apparent from the following description of certain preferred embodiments taken in conjunction with the accompanying drawings, in which:

FIGS. 12A and 12B are transparent plan views for explaining an overlap state between the coil patterns as viewed in Z direction, in which FIG. 12A illustrates a case where the coil patterns substantially completely overlap each other and FIG. 12B illustrates a case where they partially overlap each other;

DETAILED DESCRIPTION OF THE EMBODIMENTS

Preferred embodiments of the present invention will be described below with reference to the accompanying drawings.

Figure 1:
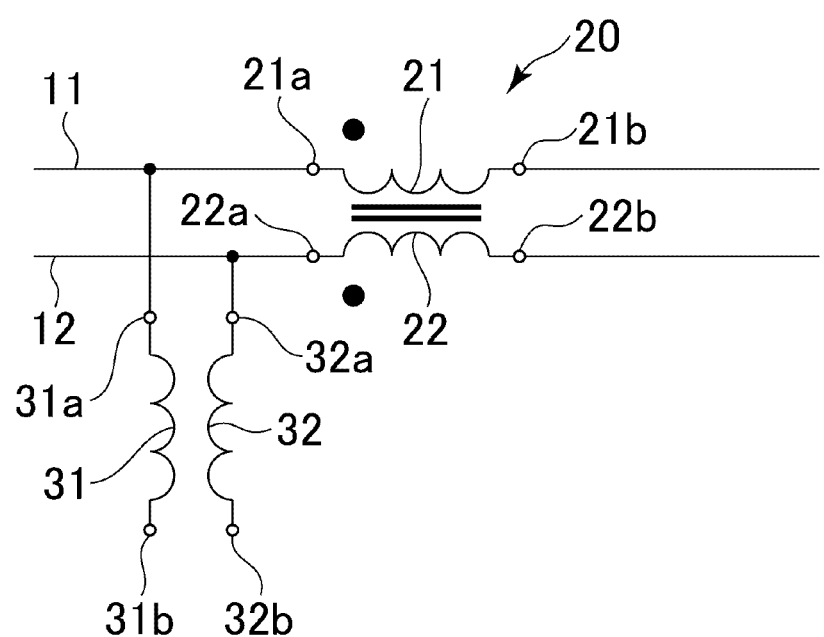
FIG. 1 is a circuit diagram illustrating a basic configuration of a common mode noise filter according to the present invention.

FIG. 1 is a circuit diagram illustrating a basic configuration of a common mode noise filter according to the present invention.

As illustrated in FIG. 1, a common mode noise filter in the basic configuration of the present invention includes a common mode filter 20 inserted into a pair of signal lines 11 and 12 and coils 31 and 32 connected respectively to the signal lines 11 and 12. The signal lines 11 and 12 constitute a signal line pair for transmitting a differential signal and are formed as a wiring pattern on a printed board, although not especially limited thereto.

The common mode filter 20 is a circuit in which two coils 21 and 22 are magnetically coupled in the same direction. That is, the winding direction from one end $21a$ to the other end $21b$ of the coil 21 and winding direction from one end $22a$ to the other end $22b$ of the coil 22 are the same, which makes the coils 21 and 22 be magnetically coupled to each other in the same direction. The phrase "magnetically coupled to each other in the same direction" refers to a state where the coils are magnetically coupled such that the magnetic fluxes thereof are enhanced each other for an in-phase component while cancelled each other for a differential component. On the other hand, a phrase "magnetically coupled to each other in the opposite directions" refers to a state where the coils are magnetically coupled such that the magnetic fluxes thereof are enhanced each other for a differential component while cancelled each other for an in-phase component. In the illustrated example, the one end side ($21a$ side and $22a$ side) of the common mode filter 20 is the signal input side, and the other end side ($21b$ side and $22b$ side) of the common mode filter 20 is the signal output side.

The coils 31 and 32 are capacitively coupled. One ends $31a$ and $32a$ are connected respectively to the corresponding signal lines 11 and 12, and the other ends $31b$ and $32b$ are opened. In the example illustrated in FIG. 1, the coils 31 and 32 are connected to the one end side ($21a$ side and $22a$ side) of the common mode filter 20, i.e., the signal input side; alternatively, however, the coils 31 and 32 may be connected to the other end side ($21b$ side and $22b$ side) of the common mode filter 20, i.e., the signal output side.

With the above configuration, a required differential signal component included in the signals flowing in the pair of signal lines 11 and 12 is transmitted without substantially receiving influence of the common filter 20 and coils 31, 32. On the other hand, a common mode component included in the signals flowing in the pair of signal lines 11 and 12 is attenuated by the common mode filter 20. Further, differential mode noise in a desired frequency band included in the signals flowing in the pair of signal lines 11 and 12 is attenuated by the coils 31 and 32.

The reason why the differential mode noise is attenuated by the coils 31 and 32 is because the inductance component (L component) of the coils 31 and 32 and capacitance component (C component) between the coils 31 and 32 LC resonate with each other. Therefore, the frequency band at which attenuation is achieved using the coils 31 and 32 can be controlled by the L and C components.

Figure 2A:
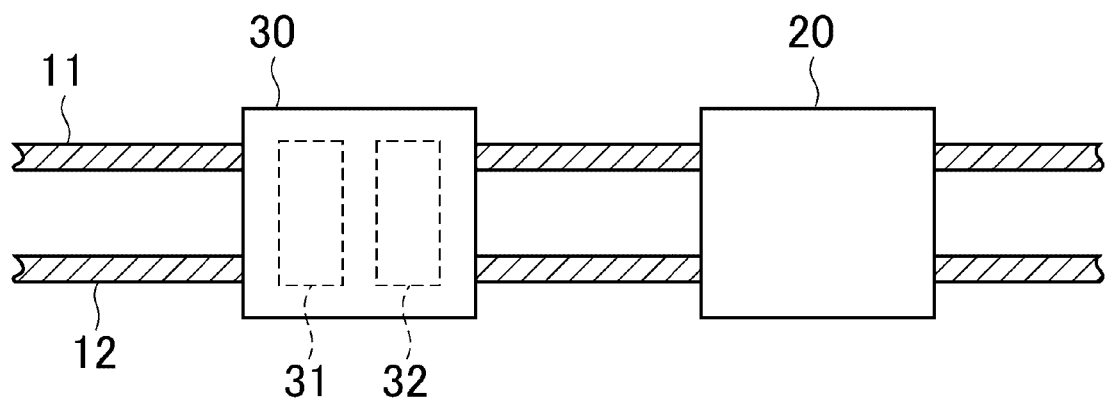
FIG. 2A illustrates an example in which a component in which a pair of coils are formed and a common mode filter are used to construct one common mode noise filter.
Figure 2B:
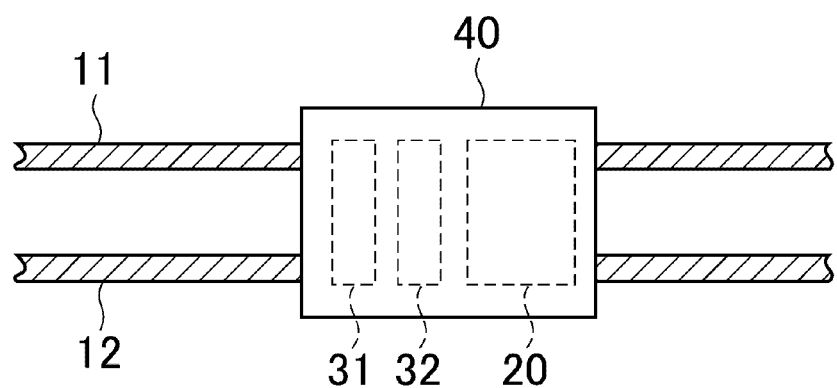
FIG. 2B illustrates an example in which the common mode filter and pair of coils are integrated in a single component.

In the present invention, the common mode noise filter may be constructed by combining different components or may be integrated in a single component. In the example illustrated in FIG. 2A, a component 30 in which the coils 31 and 32 are formed and the common mode filter 20 which is a different component from the component 30 are used to construct one common mode noise filter. This configuration allows an existing common mode filter 20 to be used without design modification. Meanwhile, in the example illustrated in FIG. 2B, the common mode filter 20 and pair of coils 31 and 32 are integrated in a single component 40. With this configuration, it is possible to prevent the number of components from being increased.

As described above, although the coils 31 and 32 need to be capacitively coupled, they may be magnetically coupled. When the coils 31 and 32 are magnetically coupled, LC resonance characteristics change to induce a change in the frequency band of differential mode noise to be removed.

FIGS. 3A to 3D are diagrams illustrating variations of magnetic coupling direction of the coils 31 and 32 and variations of connection direction thereof. In FIGS. 3A to 3D, the coils 31 and 32 are planer spiral coils. The one ends 31a and 32a of the coils 31 and 32 correspond to the outer circumferential ends of the spiral, and the other ends 31b and 32b thereof correspond to the inner peripheral ends of the spiral.

Figure 3A:
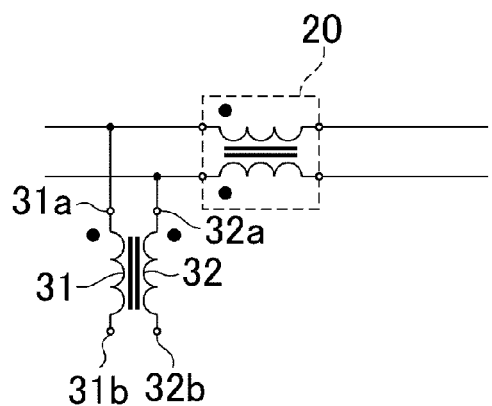
FIGS. 3A to 3D are diagrams illustrating variations of magnetic coupling direction of the coils and variations of connection direction thereof.

FIG. 3A illustrates an example in which the one ends 31a and 32a (outer circumferential ends) of the coils 31 and 32 are connected respectively to the signal lines 11 and 12 and coils 31 and 32 are magnetically coupled in the same direction. In the present example, the winding directions of the coils 31 and 32 from the one end 31a and 32a to the other ends 31b and 32b are the same and connection directions thereof are the same, resulting in magnetic coupling in the same direction.

Figure 3B:
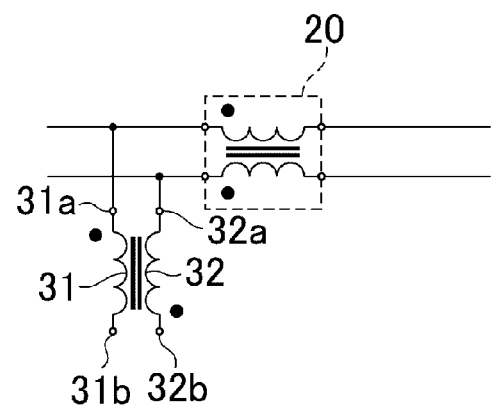

FIG. 3B illustrates an example in which the one ends 31a and 32a (outer circumferential ends) of the coils 31 and 32 are connected respectively to the signal lines 11 and 12 and coils 31 and 32 are magnetically coupled in the opposite directions. In the present example, the winding directions of the coils 31 and 32 from the one end 31a and 32a to the other ends 31b and 32b are opposite to each other and connection directions thereof are the same, resulting in magnetic coupling in the opposite directions.

Figure 3C:
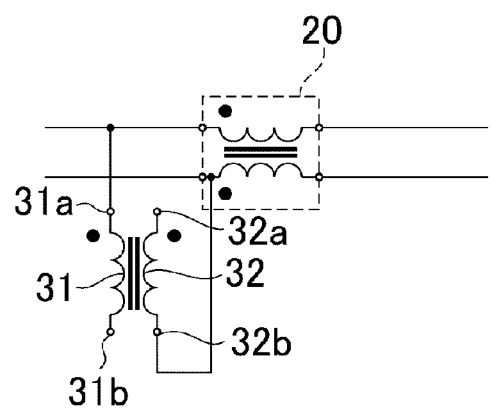

FIG. 3C illustrates an example in which the one end 31a (outer circumferential end) of the coil 31 and the other end 32b (inner peripheral end) of the coil 32 are connected respectively to the signal lines 11 and 12 and coils 31 and 32 are magnetically coupled in the opposite directions as viewed from the one end 31a and the other end 32b (when viewed from the one ends 31a and 32a, they are magnetically coupled in the same direction). In the present example, the winding directions of the coils 31 and 32 from the one ends 31a and 32a to the other ends 31b and 32b are the same and connection directions thereof are opposite to each other, resulting in magnetic coupling in the opposite directions.

Figure 3D:
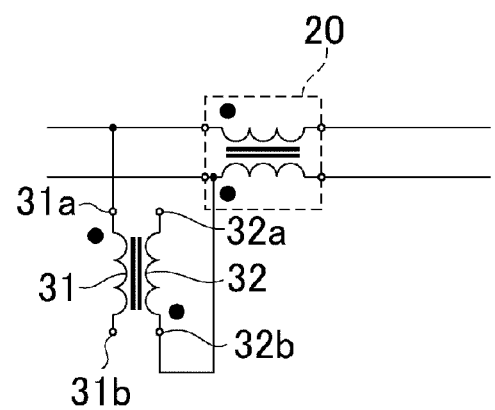

FIG. 3D illustrates an example in which the one end 31a (outer circumferential end) of the coil 31 and the other end 32b (inner peripheral end) of the coil 32 are connected respectively to the signal lines 11 and 12 and coils 31 and 32 are magnetically coupled in the same direction as viewed from the one end 31a and the other end 32b (when viewed from the one ends 31a and 32a, they are magnetically coupled in the opposite directions). In the present example, the winding directions of the coils 31 and 32 from the one end 31a and 32a to the other ends 31b and 32b are opposite to each other and connection directions thereof are also opposite to each other, resulting in magnetic coupling in the same direction.

In both the patterns illustrated in FIGS. 3A and 3D, the coils 31 and 32 are magnetically coupled in the same direction and, thus, substantially the same characteristics can be obtained from these patterns. Concretely, in these patterns, differential mode noise in a relatively low frequency band is removed. On the other hand, in both the patterns illustrated in FIGS. 3B and 3C, the coils 31 and 32 are magnetically coupled in the opposite directions and, thus, substantially the same characteristics can be obtained from these patterns. Concretely, in these patterns, differential mode noise in a relatively high frequency band is removed.

Figure 4:
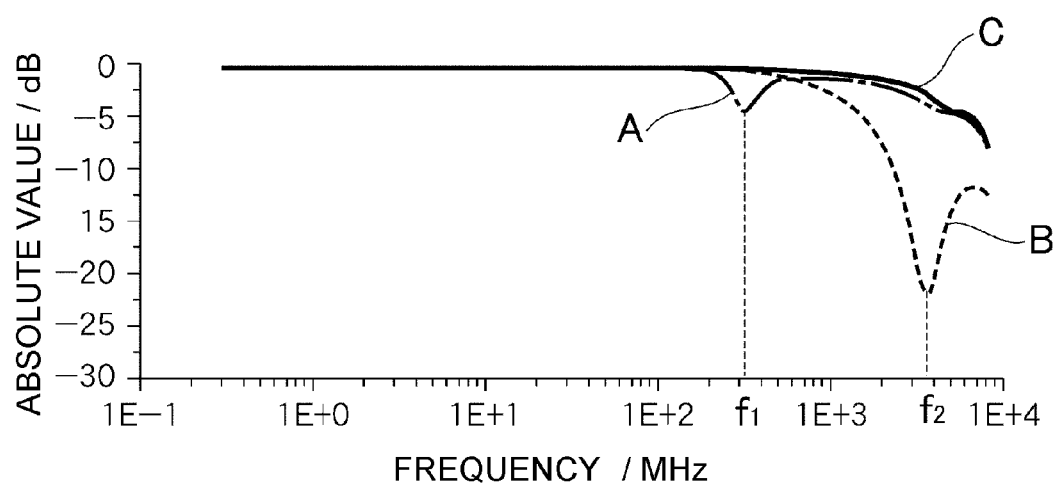
FIG. 4 is a graph illustrating pass characteristics of a differential component.

FIG. 4 is a graph illustrating a pass characteristic of the differential component.

A characteristic A illustrated in FIG. 4 is a pass characteristic of the common mode noise filter having the pattern of FIG. 3A or FIG. 3D. A characteristic B illustrated in FIG. 4 is a pass characteristic of the common mode noise filter having the pattern of FIG. 3B or FIG. 3C. Further, a pass characteristic C illustrated in FIG. 4 is a pass characteristic of the common mode noise filter in which the coils 31 and 32 have been removed from the patterns of FIGS. 3A to 3D. In the common mode noise filters of any of the above patterns, the common mode filters 20 of the same shape and size are used. Further, in the common mode noise filters having the characteristics A and B, the coils 31 and 32 of substantially the same shape and size are used.

As illustrated in FIG. 4, when using the typical common mode filter in which the coils 31 and 32 have been removed, attenuation of the differential component is small over the high-frequency region as represented by the characteristic C. On the other hand, when using the common mode filter in which the coils 31 and 32 that are magnetically coupled in the same direction are connected, a peak of the attenuation appears at a frequency f1 as represented by the characteristic A. When using the common mode filter in which the coils 31 and 32 that are magnetically coupled in the opposite directions are connected, a peak of the attenuation appears at a frequency f2 (>f1) as represented by the characteristic B. As described above, adding the coils 31 and 32 allows the differential component in a specified frequency band to be attenuated. Further, the frequency band at which attenuation is achieved can be controlled by the direction of the magnetic coupling.

A preferred concrete configuration of the common mode noise filter will be described below.

Figure 5:
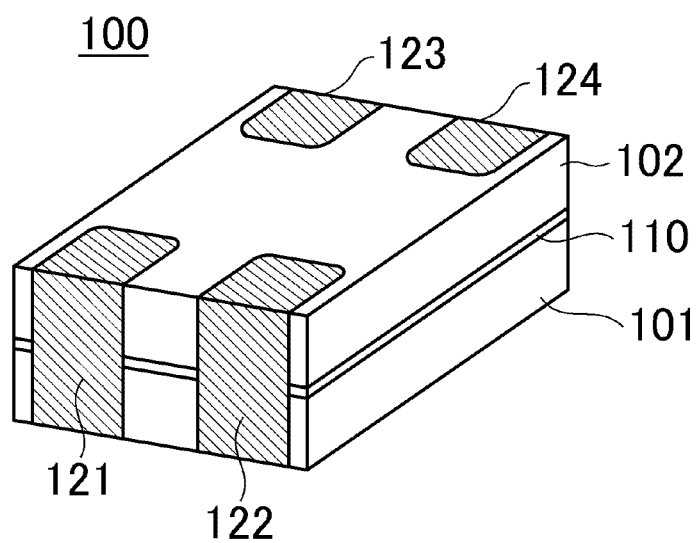
FIG. 5 is a perspective view schematically illustrating the outer appearance of a common mode noise filter according to a first embodiment of the present invention.

FIG. 5 is a perspective view schematically illustrating the outer appearance of a common mode noise filter 100 according to a first embodiment of the present invention.

As illustrated in FIG. 5, the common mode noise filter 100 according to the present embodiment is so-called a surface mount type chip component and includes magnetic substrates 101, 102 and a functional layer 110 sandwiched by the magnetic substrates 101 and 102. Further, four terminal electrodes 121 to 124 are formed on the outer circumferential surface of a stacked body constituted by the magnetic substrate 101, functional layer 110, and magnetic substrate 102. The magnetic substrates 101 and 102 each play a role of physically protecting the functional layer 110 and serves as a closed magnetic path of the common mode filter. As a material of the magnetic substrates 101 and 102, a sintered ferrite, a composite ferrite (resin containing ferrite powder) or the like can be used. It is particularly preferably to use a sintered ferrite having high mechanical strength and excellent in magnetic characteristics.

As described above, the number of the terminal electrodes formed in the common mode noise filter 100 according to the present embodiment is four. The terminal electrodes 121 and 122 are terminals corresponding to the other ends 21b and 22b of the coils 21 and 22 illustrated in FIG. 1, respectively, and the terminals electrodes 123 and 124 are terminals corresponding to the one ends 21a and 22a of the coils 21 and 22 illustrated in FIG. 1, respectively. Thus, in an actual use state, the terminal electrodes 121 and 123 are inserted into the signal line 11, and terminal electrodes 122 and 124 are inserted into the signal line 12. In the present embodiment, terminal electrodes corresponding to the other ends 31b and 32b of the coils 31 and 32 are not formed. This is because that the other ends 31b and 32b of the coils 31 and 32 are opened, which eliminates the need to form the terminal electrode for connection to outside.

It is possible to realize the circuit illustrated in FIG. 1 even in a configuration where the terminal electrodes corresponding respectively to the other ends 31b and 32b of the coils 31 and 32 are formed but they are not actually connected to the corresponding ends of the coils or connected only to an open conductive pattern. In this case, however, the outer dimension of the common mode noise filter 100 is wastefully increased and, at the same time, characteristics actually obtained may deviate from designed values of the coils 31 and 32 due to influence of the terminal electrodes or open conductive pattern. In view of this, preferably the terminal electrodes corresponding to the other ends 31b and 32b of the coils 31 and 32 are not formed. That is, it is important for the common mode noise filter 100 according to the present embodiment to have four terminals.

Figure 6:
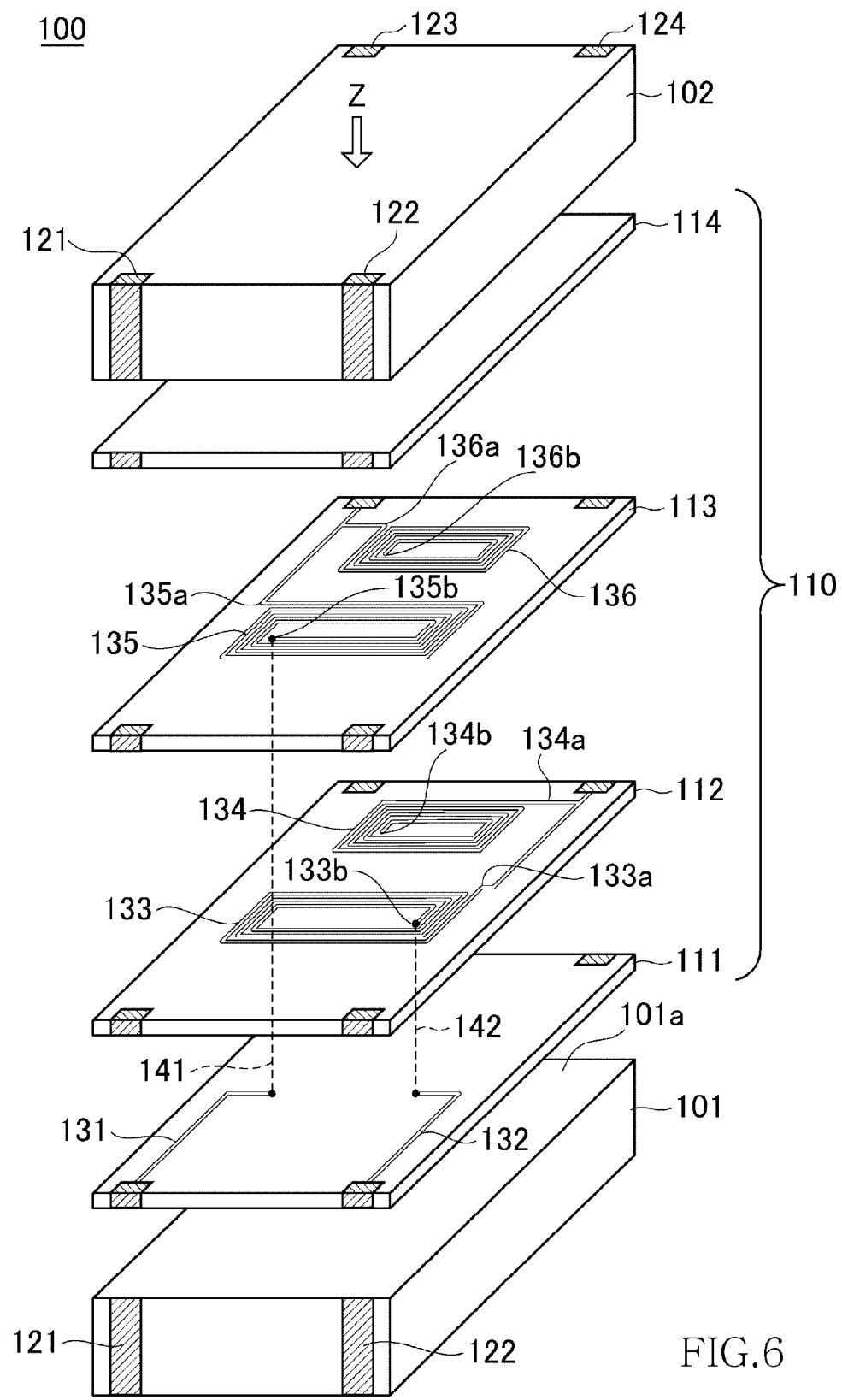
FIG. 6 is an exploded perspective view schematically illustrating the common mode noise filter.
Figure 7:
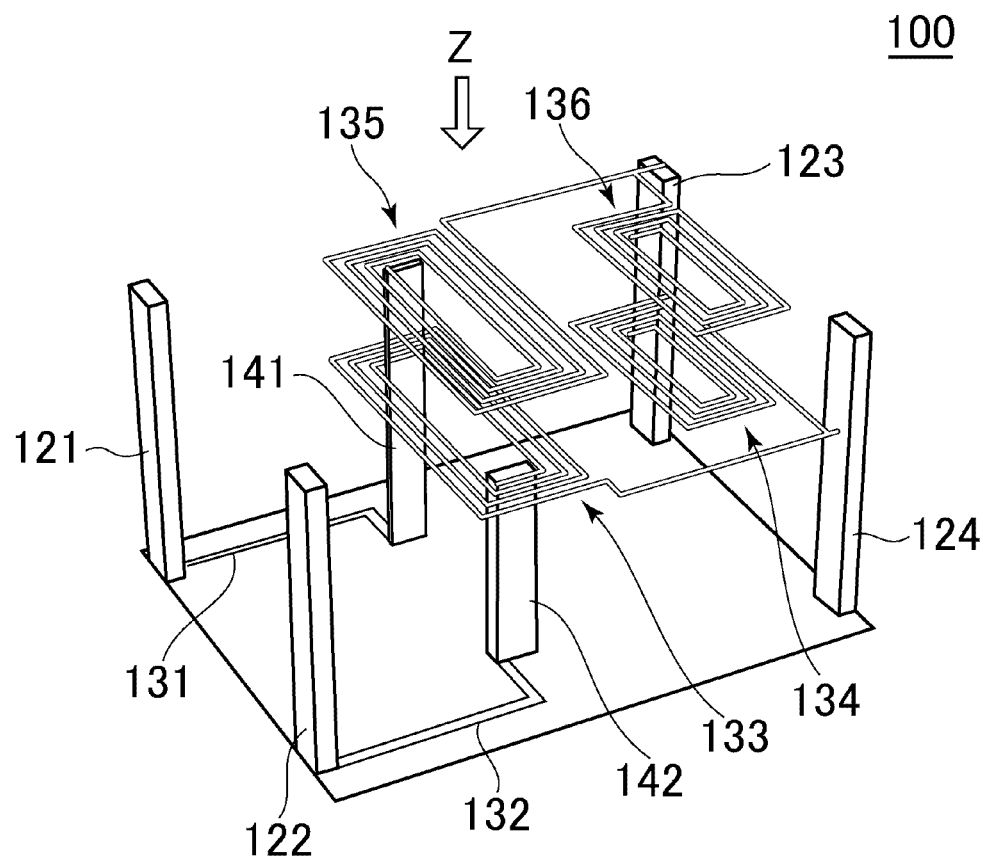
FIG. 7 is a transparent perspective view schematically illustrating only conductive patterns included in a functional layer of the common mode noise filter.

FIG. 6 is an exploded perspective view schematically illustrating the common mode noise filter 100. FIG. 7 is a transparent perspective view schematically illustrating only conductive patterns included in the functional layer 110 of the common mode noise filter 100.

As illustrated in FIG. 6, the functional layer 110 includes insulating layers 111 to 113 and a bonding layer 114 which are stacked in the direction from the magnetic substrate 101 side to magnetic substrate 102 side and various conductive patterns formed on the surfaces of the insulating layers 111 to 113.

The insulating layers 111 to 113 each play a role of insulating the vertically stacked conductive patterns from each other and ensuring flatness of a ground surface on which the conductive pattern is formed. As a material of the insulating layers 111 to 113, it is preferable to use a resin material excellent in insulation properties and workability, such as polyimide resin or epoxy resin. As a material of the conductive pattern, it is preferable to use Cu, Al, or the like excellent in conductivity and workability. The conductive pattern may be formed according to a subtractive method in which a conductor is formed on the entire surface followed by etching using photolithography or an additive method in which a conductive pattern is selectively formed by plating.

The bonding layer 114 is a layer required for bonding the magnetic substrate 102 onto the insulating layer 113. Further, the bonding layer 114 plays a role of reducing irregularity on the surface of the magnetic substrate 102 so as to enhance adhesiveness. Although not especially limited, epoxy resin, polyimide resin, polyamide resin, or the like may be used as a material of the boding layer 114.

In the wiring layer on the surface of the insulating layer 111, extracting conductors 131 and 132 are formed. One end of the extracting conductor 131 is connected to the terminal electrode 121 and the other end thereof is connected to a coil pattern 135 through a through-hole conductor 141 penetrating the insulating layers 112 and 113. Similarly, one end of the extracting conductor 132 is connected to the terminal electrode 122 and the other end thereof is connected to a coil pattern 133 through a through-hole conductor 142 penetrating the insulating layer 112.

Coil patterns 133 and 134 are formed in the wiring layer on the surface of the insulating layer 112. The coil pattern 133 corresponds to the coil 22 illustrated in FIG. 1, and coil pattern 134 corresponds to the coil 32 illustrated in FIG. 1. An outer circumferential end 133a of the coil pattern 133 corresponds to the one end 22a of the coil 22 and is connected to the terminal electrode 124 as well as to an outer circumferential end 134a of the coil pattern 134. The outer circumferential end 134a of the coil pattern 134 corresponds to the one end 32a of the coil 32. Further, an inner end 133b of the coil pattern 133 corresponds to the other end 22b of the coil 22 and is connected to the terminal electrode 122 through the through-hole conductor 142 and extracting conductor 132. An inner circumferential end 134b of the coil pattern 134 is not connected to any conductor but is opened.

Coil patterns 135 and 136 are formed in the wiring layer on the surface of the insulating layer 113. The coil pattern 135 corresponds to the coil 21 illustrated in FIG. 1, and coil pattern 136 corresponds to the coil 31 illustrated in FIG. 1. An outer circumferential end 135a of the coil pattern 135 corresponds to the one end 21a of the coil 21 and is connected to the terminal electrode 123 as well as to an outer circumferential end 136a of the coil pattern 136. The outer circumferential end 136a of the coil pattern 136 corresponds to the one end 31a of the coil 31. Further, an inner circumferential end 135b of the coil pattern 135 corresponds to the other end 21b of the coil 21 and is connected to the terminal electrode 121 through the through-hole conductor 141 and extracting conductor 131. An inner circumferential end 136b of the coil pattern 136 is not connected to any conductor but is opened.

The coil pattern 133 and coil pattern 135 have the same planar shape and substantially completely overlap each other in Z direction (along the stacking direction), that is, in Z direction perpendicular to a main surface 101a of the magnetic substrate 101. Thus, when current is made to flow in the coil patterns 133 and 135, magnetic fields generated are coupled to each other. In the present example, the winding direction from the inner circumferential end of the coil pattern 133 to the outer circumferential end thereof as viewed in Z direction is counterclockwise direction, and the winding direction from the inner circumferential end of the coil pattern 135 to the outer circumferential end thereof as viewed in Z direction is also counterclockwise direction. Accordingly, when current is made to flow from the inner circumferential ends or outer circumferential ends of the coil patterns 133 and 135, the coil patterns 133 and 135 are magnetically coupled to each other in the same direction.

Although not especially limited, the coil pattern 134 and coil pattern 136 also overlap each other in Z direction in the present example. Thus, when current is made to flow in the coil patterns 134 and 136, magnetic fields generated are coupled to each other. Further, the overlap in Z direction causes capacitance between the coil patterns 134 and 136. In the present example, the winding direction from the outer circumferential end of the coil pattern 134 to the inner circumferential end thereof as viewed in Z direction is counterclockwise direction, and the winding direction from the outer circumferential end of the coil pattern 136 to the inner circumferential end thereof as viewed in Z direction is also counterclockwise direction. Accordingly, when current is made to flow from the outer circumferential ends of the coil patterns 134 and 136, the coil patterns 134 and 136 are magnetically coupled to each other in the same direction.

With the above configuration, the common mode noise filter 100 according to the present embodiment constructs the circuit illustrated in FIG. 3A. Thus, it is possible not only to remove the common mode component but also to attenuate the differential component in a relatively low frequency band as described using FIG. 4. In addition, the coil patterns 133 and 134 are formed in the same wiring layer, and the coil patterns 135 and 136 are formed in the same wiring layer, so that it is possible to minimize the number of the insulating layers. Further, one ends of the coil patterns 134 and 136 are connected respectively to the corresponding one ends (outer circumferential ends 133a and 135a) of the coil patterns 133 and 135, and the coil patterns 134 and 136 have substantially the same configuration, so that there is little adverse effect on a differential component required to be passed through.

Figure 8:
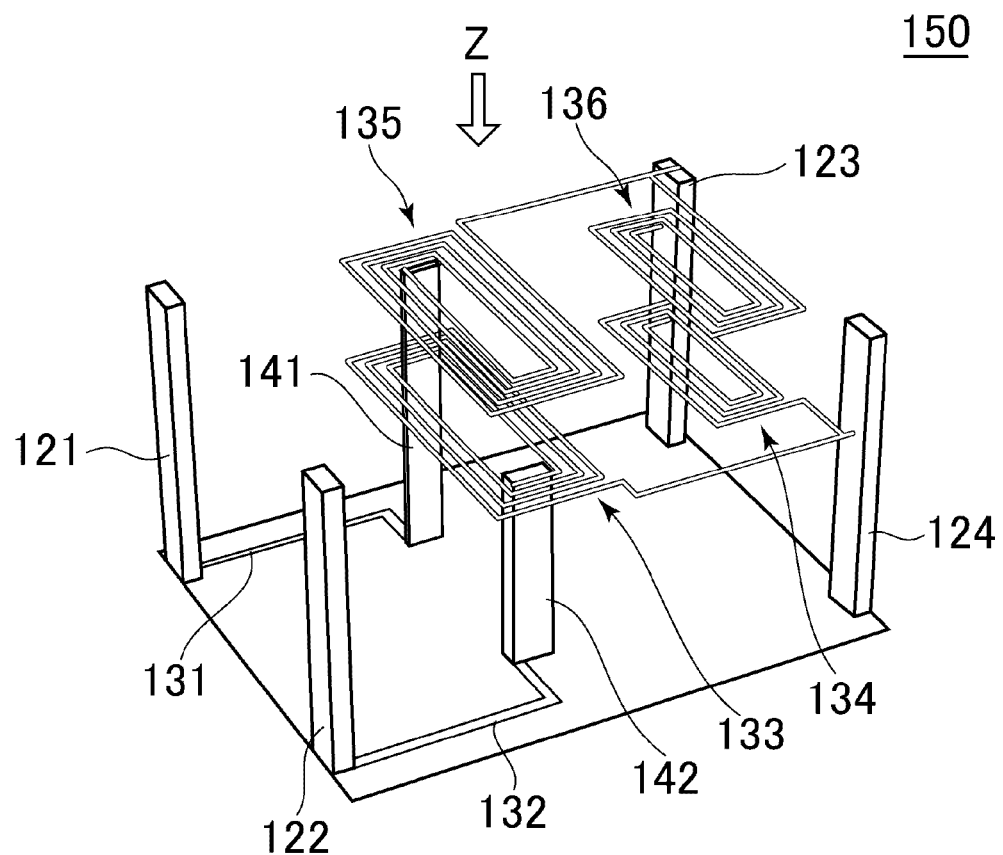
FIG. 8 is a transparent perspective view schematically illustrating only conductive patterns included in the functional layer of a common mode noise filter according to a modification of the first embodiment.

FIG. 8 is a transparent perspective view schematically illustrating only conductive patterns included in the functional layer of a common mode noise filter 150 according to a modification of the first embodiment.

The common mode noise filter 150 according to the modification differs from the abovementioned common mode noise filter 100 in that the winding direction from the outer circumferential end of the coil pattern 134 to the inner circumferential end thereof as viewed in Z direction is clockwise direction, and the winding direction from the outer circumferential end of the coil pattern 136 to the inner circumferential end thereof as viewed in Z direction is also clockwise direction. The other points are the same as those in the common mode noise filter 100. Accordingly, the same components are denoted by the same reference numerals, and overlapping descriptions are omitted. Also in the present example, when current is made to flow from the outer circumferential ends of the coil patterns 134 and 136, the coil patterns 134 and 136 are magnetically coupled to each other in the same direction, allowing the same effect as in the common mode noise filter 100 to be obtained.

As described above, the winding direction of the coil patterns 133 and 135 may be the same as or opposite to the winding direction of the coil patterns 134 and 136.

Figure 9:
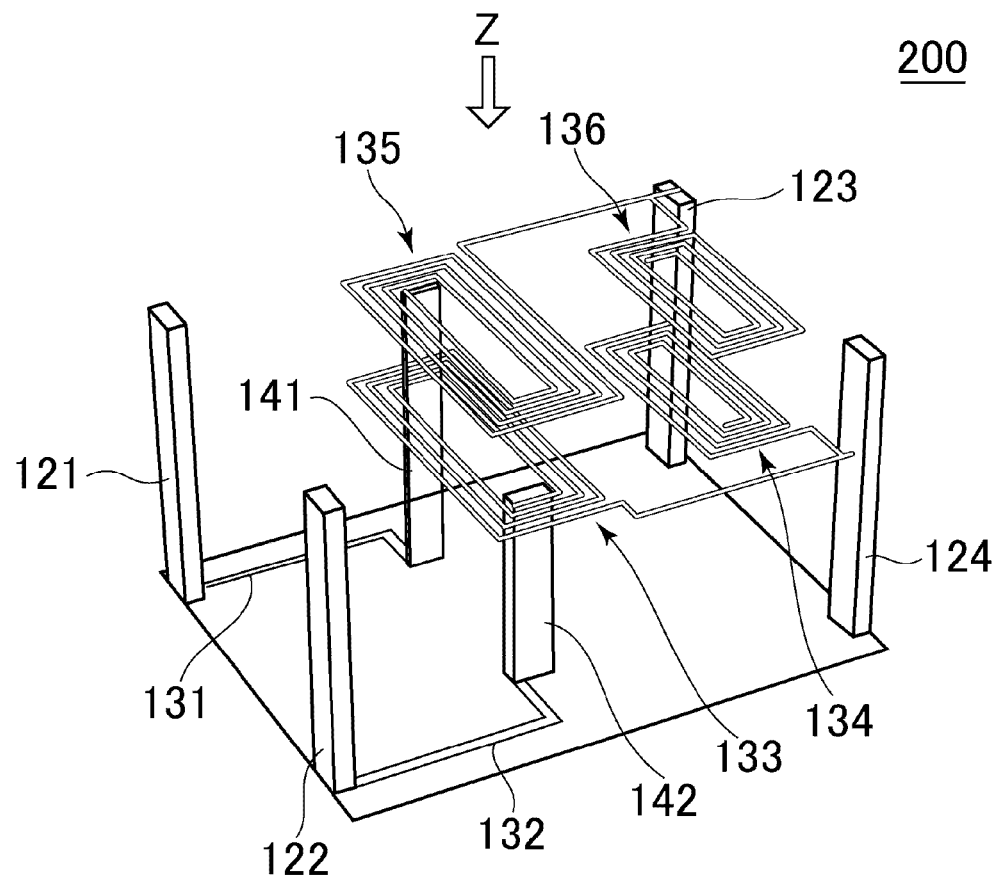
FIG. 9 is a transparent perspective view schematically illustrating only conductive patterns included in the functional layer of a common mode noise filter according to a second embodiment.

FIG. 9 is a transparent perspective view schematically illustrating only conductive patterns included in the functional layer of a common mode noise filter 200 according to a second embodiment.

As illustrated in FIG. 9, in the common mode noise filter 200 according to the second embodiment differs from the abovementioned common mode noise filter 100 in that the winding direction from the outer circumferential end of the coil pattern 134 to the inner circumferential end thereof as viewed in Z direction is clockwise direction, and the winding direction from the outer circumferential end of the coil pattern 136 to the inner circumferential end thereof as viewed in Z direction is counterclockwise direction. The other points are the same as those in the common mode noise filter 100. Accordingly, the same components are denoted by the same reference numerals, and overlapping descriptions are omitted.

With the above configuration, the coil patterns 134 and 136 are magnetically coupled to each other in the opposite directions. Thus, the common mode noise filter 200 according to the present embodiment constructs the circuit illustrated in FIG. 3B. Thus, it is possible not only to remove the common mode component but also to attenuate the differential component in a relatively high frequency band as described using FIG. 4.

Figure 10A:
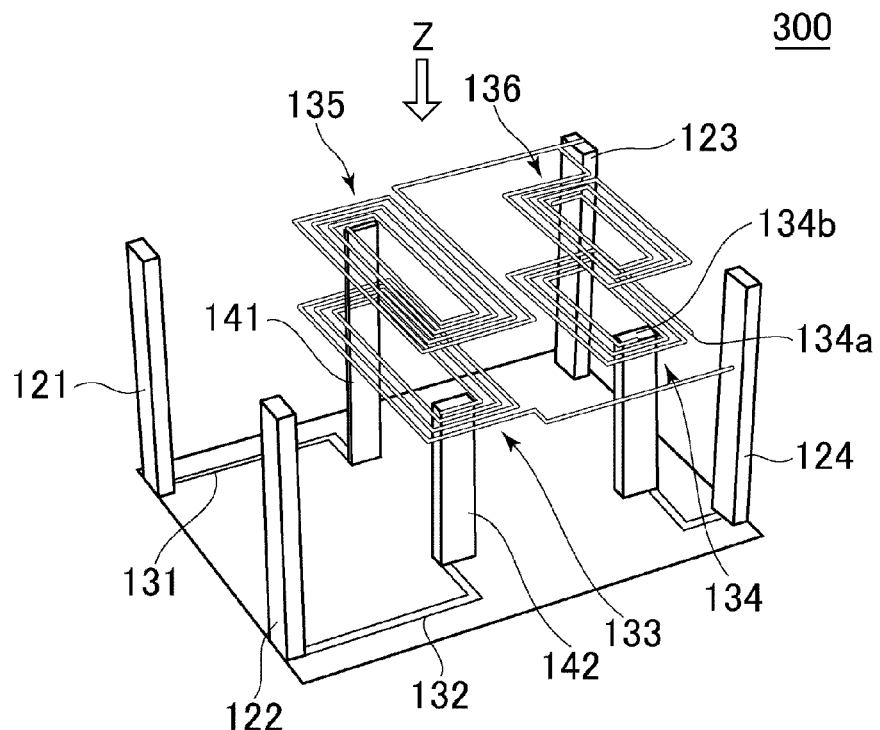
FIG. 10A is a transparent perspective view schematically illustrating only conductive patterns included in the functional layer of a common mode noise filter according to a third embodiment.
Figure 10B:
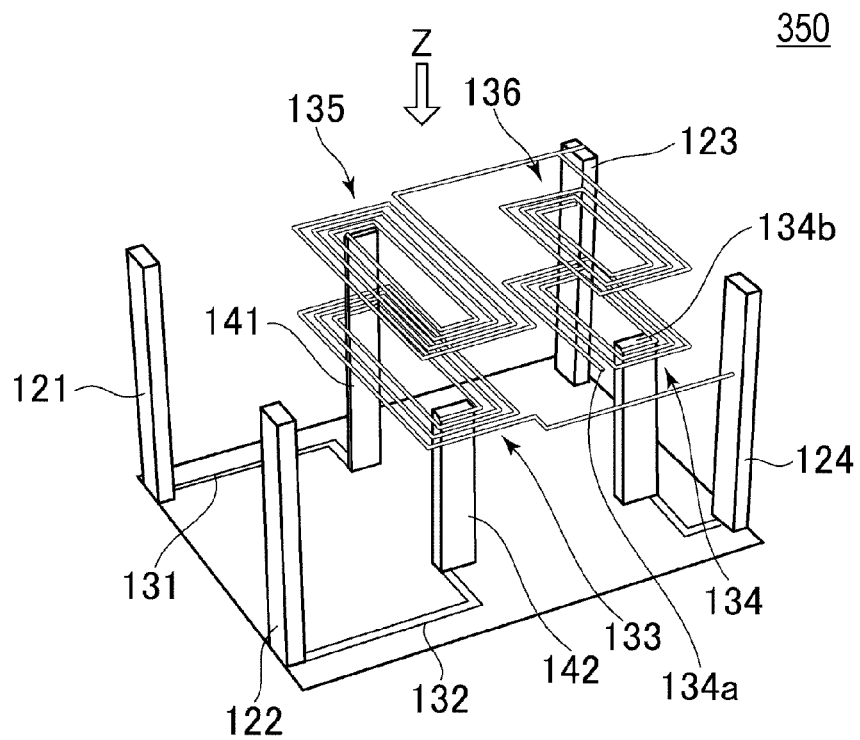
FIG. 10B is a transparent perspective view schematically illustrating only conductive patterns included in the functional layer of a common mode noise filter according to a modification of the third embodiment.

FIG. 10A is a transparent perspective view schematically illustrating only conductive patterns included in the functional layer of a common mode noise filter 300 according to a third embodiment, and FIG. 10B is a transparent perspective view schematically illustrating only conductive patterns included in the functional layer of a common mode noise filter 350 according to a modification of the third embodiment.

As illustrated in FIG. 10A, in the common mode noise filter 300 according to the third embodiment, the winding direction from the outer circumferential end of the coil pattern 134 to the inner circumferential end thereof as viewed in Z direction is counterclockwise direction, and the winding direction from the outer circumferential end of the coil pattern 136 to the inner circumferential end thereof as viewed in Z direction is also counterclockwise direction. However, the coil pattern 134 is connected, at its inner circumferential end 134b, to the terminal electrode 124, and the outer circumferential end 134a is opened. The other points are the same as those in the common mode noise filter 100. Accordingly, the same components are denoted by the same reference numerals, and overlapping descriptions are omitted.

With the above configuration, the coil patterns 134 and 136 are magnetically coupled to each other in the opposite directions. Therefore, the common mode noise filter 300 according to the present embodiment constructs the circuit illustrated in FIG. 3C. Thus, it is possible not only to remove the common mode component but also to attenuate the differential component in a relatively high frequency band as described using FIG. 4.

The common mode noise filter 300 according to the modification illustrated in FIG. 10B differs from the abovementioned common mode noise filter 350 in that the winding direction from the outer circumferential end of the coil pattern 134 to the inner circumferential end thereof as viewed in Z direction is clockwise direction, and the winding direction from the outer circumferential end of the coil pattern 136 to the inner circumferential end thereof as viewed in Z direction is also clockwise direction. The other points are the same as those in the common mode noise filter 300. Accordingly, the same components are denoted by the same reference numerals, and overlapping descriptions are omitted. Also in the present example, the coil patterns 134 and 136 are magnetically coupled to each other in the opposite directions, allowing the same effect as in the common mode noise filter 300 to be obtained.

Figure 11:
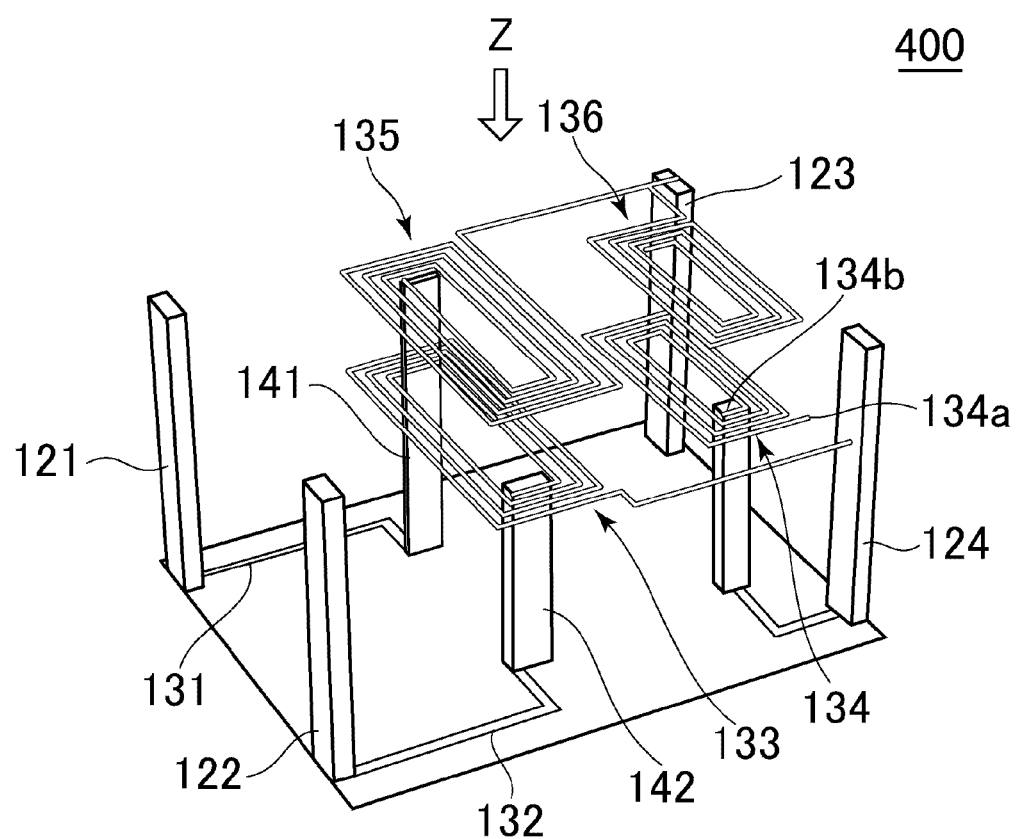
FIG. 11 is a transparent perspective view schematically illustrating only conductive patterns included in the functional layer of a common mode noise filter according to a fourth embodiment.

FIG. 11 is a transparent perspective view schematically illustrating only conductive patterns included in the functional layer of a common mode noise filter 400 according to a fourth embodiment.

As illustrated in FIG. 11, in the common mode noise filter 400 according to the fourth embodiment, the winding direction from the outer circumferential end of the coil pattern 134 to the inner circumferential end thereof as viewed in Z direction is clockwise direction, and the winding direction from the outer circumferential end of the coil pattern 136 to the inner circumferential end thereof as viewed in Z direction is counterclockwise direction. However, the coil pattern 134 is connected, at its inner circumferential end 134b, to the terminal electrode 124, and the outer circumferential end 134a is opened. The other points are the same as those in the common mode noise filter 100. Accordingly, the same components are denoted by the same reference numerals, and overlapping descriptions are omitted.

With the above configuration, the coil patterns 134 and 136 are magnetically coupled to each other in the same direction. Therefore, the common mode noise filter 400 according to the present embodiment constructs the circuit illustrated in FIG. 3D. Thus, it is possible not only to remove the common mode component but also to attenuate the differential component in a relatively low frequency band as described using FIG. 4.

As described above, the winding directions of the coil patterns 134 and 136 may be arbitrarily determined and which one of the inner and outer circumferential ends is opened may also be arbitrarily determined. The winding direction and open end are appropriately selected in consideration of the frequency band of the differential mode noise to be attenuated or ease of design.

Figure 12A:
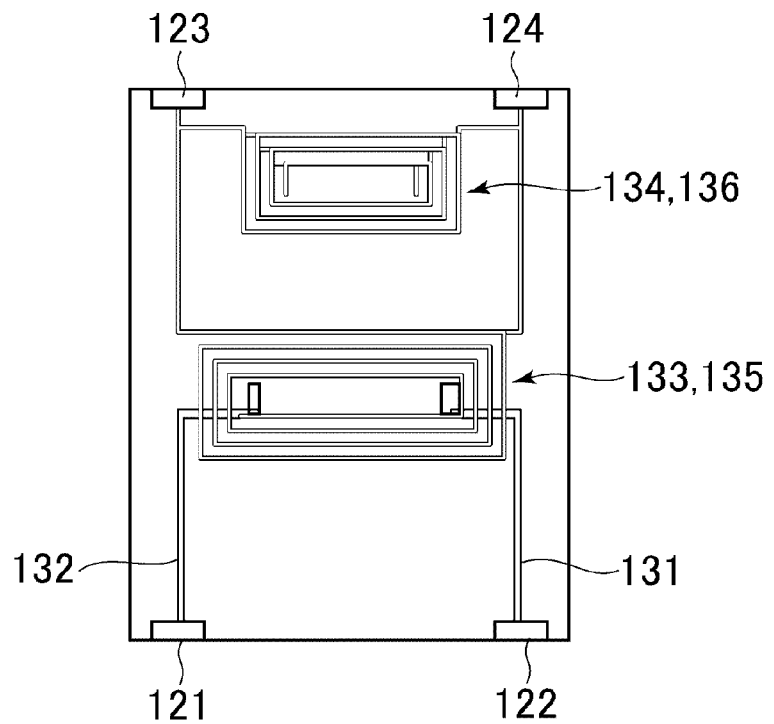
Figure 12B:
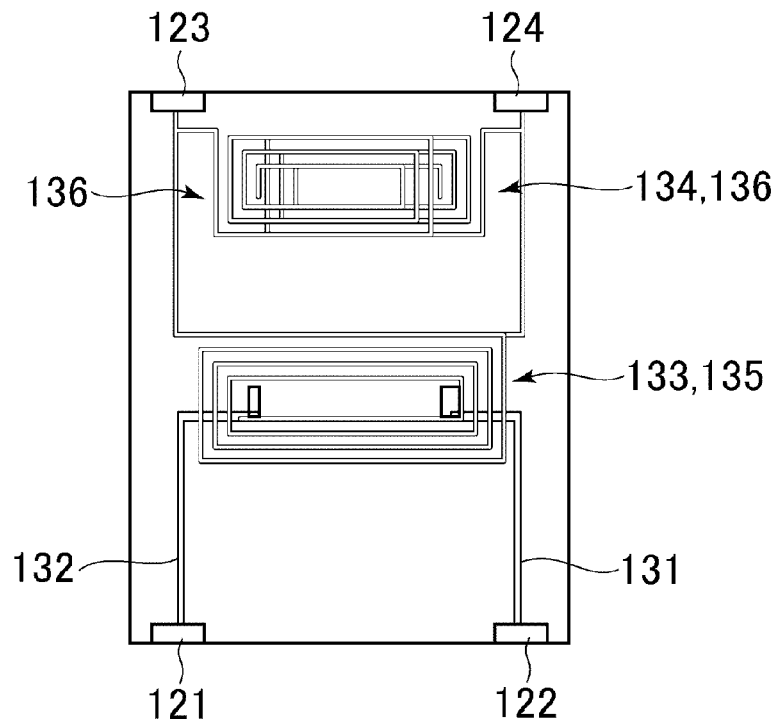

FIGS. 12A and 12B are transparent plan views for explaining an overlap state between the coil patterns 134 and 136 as viewed in Z direction, in which FIG. 12A illustrates a case where the coil patterns 134 and 136 substantially completely overlap each other and FIG. 12B illustrates a case where they partially overlap each other.

In the example illustrated in FIG. 12A, the coil patterns 134 and 136 substantially completely overlap each other in the Z direction, so that the capacitive coupling and magnetic coupling between them become relatively strong. On the other hand, in the example illustrated in FIG. 12B, although the coil patterns 134 and 136 have substantially the same shapes, they have central axes displaced from each other, so that they overlap each other only partially. Accordingly, the capacitive coupling and magnetic coupling between the coil patterns 134 and 136 become weaker than in the example illustrated in FIG. 12A. Thus, by adjusting the overlap state between the coil patterns 134 and 136, it is possible to control the degrees of the capacitive coupling and magnetic coupling between the coils 31 and 32 illustrated in FIG. 1. When it is necessary to change the degree of the capacitive coupling without significantly changing the degree of the magnetic coupling, it is preferable to adjust the widths of the conductor patterns constituting the coil patterns 134 and 136 or to form a capacitor electrode pattern having a large area at some portion. Note that in the present invention the overlap between the coil patterns 134 and 136 is not essential, but a configuration may be adopted in which the coil patterns 134 and 136 do not overlap each other at all in the case where it is necessary to sufficiently weaken the capacitive coupling or magnetic coupling.

Figure 13:
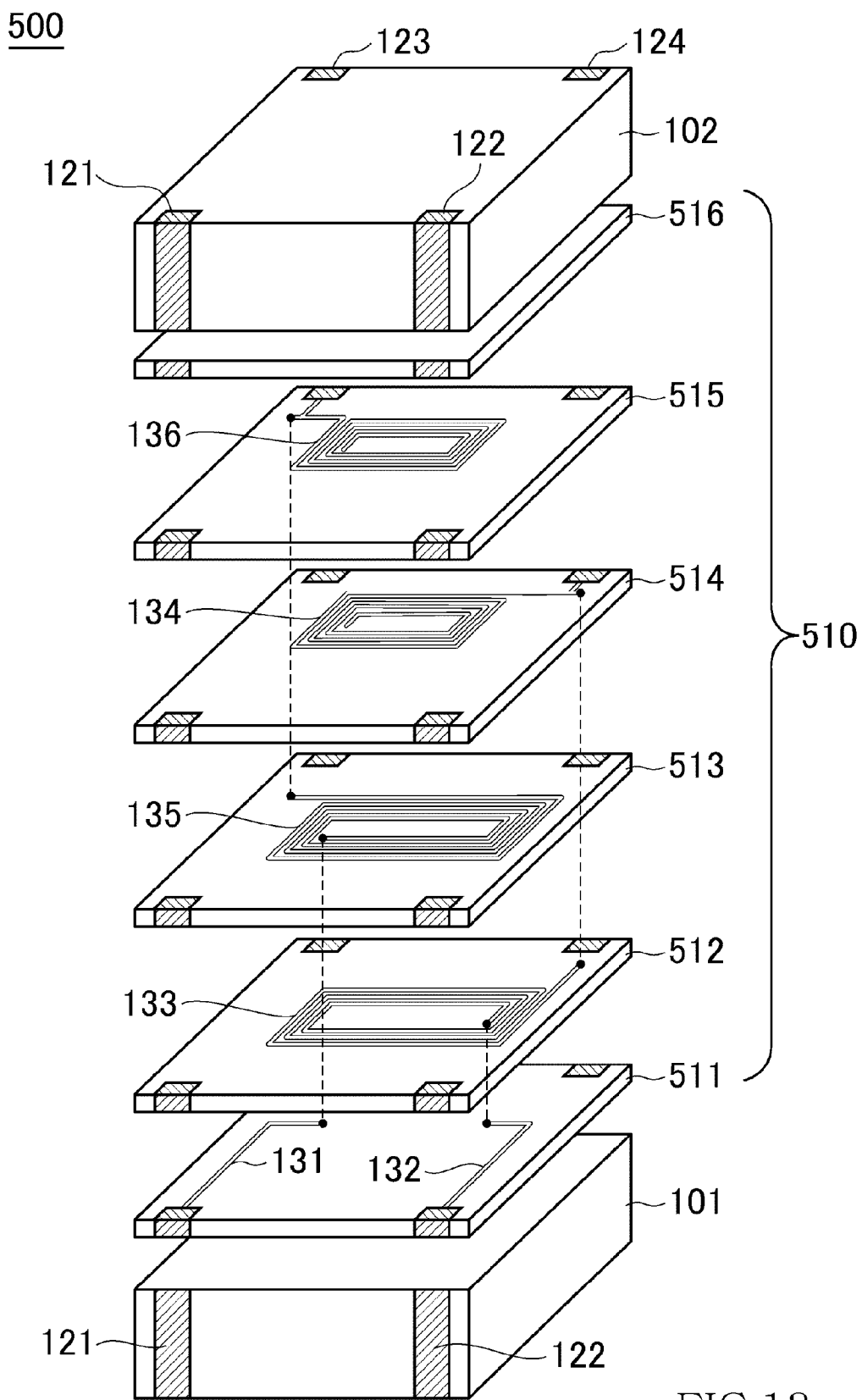
FIG. 13 is an exploded perspective view schematically illustrating a common mode noise filter according to a fifth embodiment of the present invention.

FIG. 13 is an exploded perspective view schematically illustrating a common mode noise filter 500 according to a fifth embodiment of the present invention.

As illustrated in FIG. 13, in the common mode noise filter 500 according to the present embodiment, a functional layer 510 includes insulating layers 511 to 515 and a bonding layer 516 which are stacked in the direction from the magnetic substrate 101 side to magnetic substrate 102 side and various conductive patterns formed on the surfaces of the insulating layers 511 to 515. Extracting conductors 131 and 132 are formed in a wiring layer on the surface of the insulating layer 511, and coil patterns 133, 135, 134, and 136 are formed in wiring layers on the surface of the insulating layers 512 to 515, respectively. The other points are the same as those in the common mode noise filter 100 illustrated in FIG. 6. Accordingly, the same components are denoted by the same reference numerals, and overlapping descriptions are omitted.

The common mode noise filter 500 according to the present embodiment is the same as the common mode noise filter 100 illustrated in FIG. 6 in terms of circuit configuration. Therefore, in the common mode noise filter 500, it is possible to obtain substantially the same effect as in the common mode noise filter 100. In addition, in this case, the four coil patterns 133 to 136 are formed in different wiring layers, respectively, so that the planar size of each component can be reduced.

Although not illustrated, a magnetic body may be disposed between the insulating layers 513 and 514. With this configuration, the magnetic interference between the coil patterns 133, 135 constituting the common mode filter and coil patterns 134, 136 constituting the differential mode filter is reduced, allowing the common mode filter to bring out its original characteristics.

Figure 14:
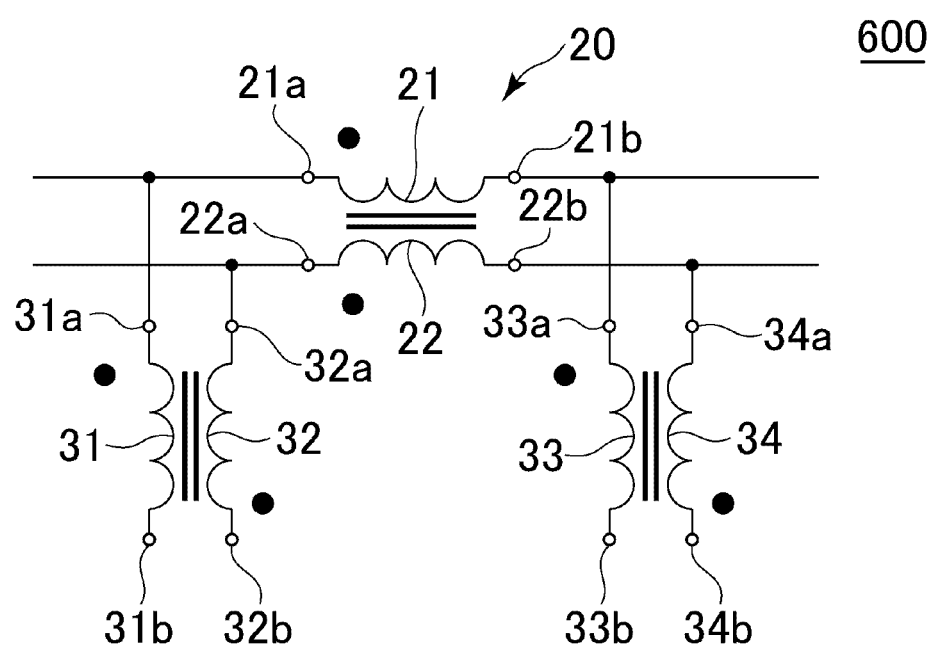
FIG. 14 is a circuit diagram of a common mode noise filter according to a sixth embodiment of the present invention.

FIG. 14 is a circuit diagram of a common mode noise filter 600 according to a sixth embodiment of the present invention.

As illustrated in FIG. 14, the common mode noise filter 600 according to the sixth embodiment has a configuration in which a pair of coils 31 and 32 illustrated in FIG. 3B are connected to both end sides of the common mode filter 20. More specifically, the common mode noise filter 600 according to the present embodiment is constituted by a common mode filter 20 inserted into a pair of signal lines 11 and 12, capacitively coupled coils 31 and 32 connected respectively to the signal lines 11 and 12, and capacitively coupled coils 33 and 34 connected respectively to the signal lines 11 and 12.

One ends 31a and 32a of the coils 31 and 32 are connected to one ends 21a and 22a of the common mode filter 20, respectively, and the other ends 31b and 32b of the coils 31 and 32 are opened. Meanwhile, one ends 33a and 34a of the coils 33 and 34 are connected to the other ends 21b and 22b of the common mode filter 20, respectively, and the other ends 33b and 34b of the coils 33 and 34 are opened. In the example of FIG. 13, the coils 31 and 32 are magnetically coupled to each other in the opposite directions, and the coils 33 and 34 are magnetically coupled to each other in the opposite directions.

With the above configuration, it is possible to attenuate the differential mode noise in a desired frequency band more effectively. For example, assuming that the characteristics of the differential mode filter constituted by the coils 31 and 32 and those of the differential mode filter constituted by the coils 33 and 34 are the same, it is possible to attenuate the differential mode noise in a desired frequency band more significantly. Further, the coils having the same characteristics are connected to both end sides of the common mode filter 20, so that when the common mode noise filter is integrated into a single component, it is possible to eliminate directionality of the component. On the other hand, when the characteristics of the differential mode filter constituted by the coils 31 and 32 and those of the differential mode filter constituted by the coils 33 and 34 are made different from each other, it is possible to attenuate differential mode noise in a plurality of frequency bands.

Figure 15:
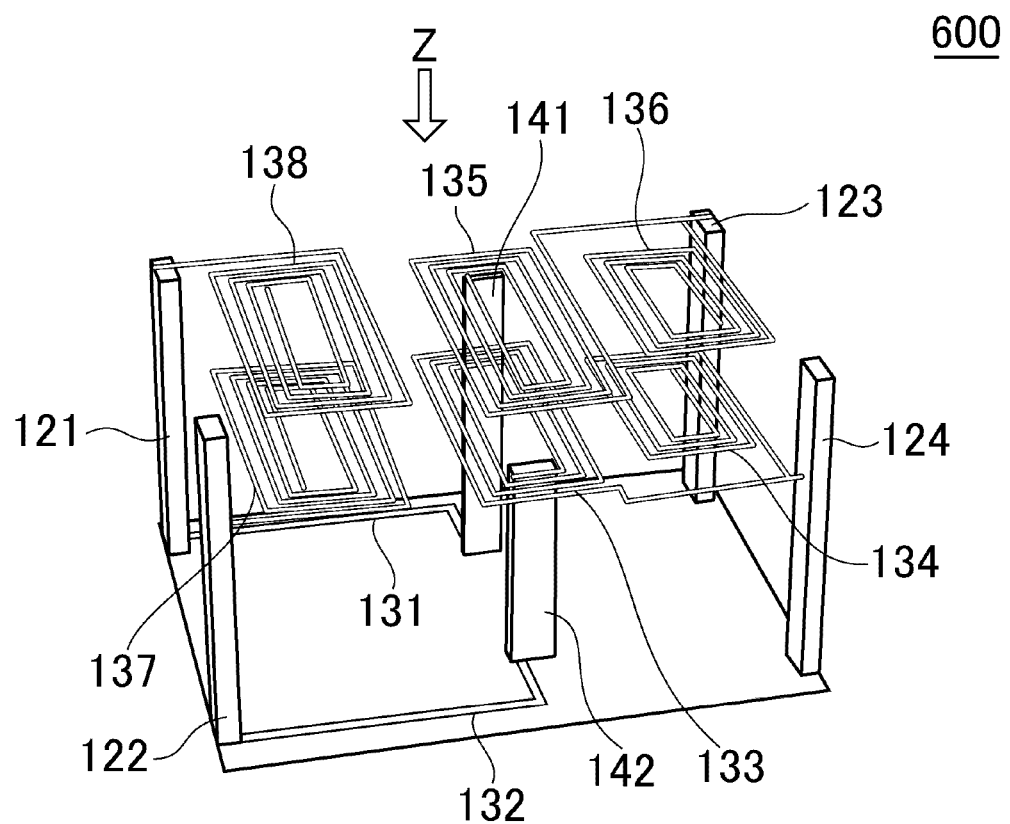
FIG. 15 is a transparent perspective view schematically illustrating only conductive patterns in the case where the common mode noise filter is integrated in a single component.

FIG. 15 is a transparent perspective view schematically illustrating only conductive patterns in the case where the common mode noise filter 600 is integrated in a single component.

In the example illustrated in FIG. 15, coil patterns 133, 134, and 137 are formed in the same wiring layer, and coil patterns 135, 136, and 138 are formed in the same wiring layer. The coil patterns 133 and 135 constituting the common mode filter are formed in substantially the center portion, a pair of coil patterns 134 and 136 are formed on terminal electrodes 123 and 124 side, and a pair of coil patterns 137 and 138 are formed on terminal electrodes 121 and 122 side.

As illustrated in FIG. 15, the coil patterns 134, 136, 137, and 138 are connected, at their outer circumferential ends, to the corresponding terminal electrodes 124, 123, 122, and 121, respectively. All the inner circumferential ends of the coil patterns 134, 136, 137, and 138 are opened. Further, the winding direction from the outer circumferential ends of the coil patterns 134 and 137 to the inner circumferential ends thereof as viewed in Z direction is counterclockwise direction, while the winding direction from the outer circumferential ends of the coil patterns 136 and 138 to the inner circumferential ends thereof as viewed in Z direction is clockwise direction. The pair of coil patterns 134 and 136 correspond to the coils 31 and 32 illustrated in FIG. 14, and pair of coil patterns 137 and 138 correspond to the coils 33 and 34 illustrated in FIG. 14.

Figure 16:
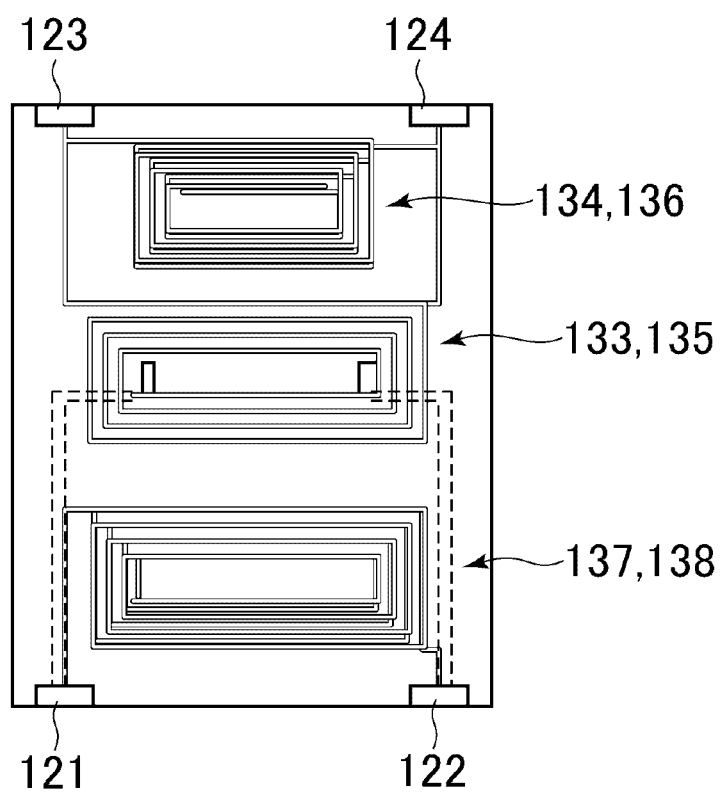
FIG. 16 is a transparent plan view for explaining an overlap state between the coil patterns and over lap state between the coil patterns as viewed in Z direction.

FIG. 16 is a transparent plan view for explaining an overlap state between the coil patterns 134 and 136 and overlap state between the coil patterns 137 and 138 as viewed in Z direction.

As illustrated in FIG. 16, in the present example, the coil patterns 134 and 136 substantially completely overlap each other in the Z direction, so that the capacitive coupling and magnetic coupling between them become relatively strong. Similarly, the coil patterns 137 and 138 substantially completely overlap each other in the Z direction, so that the capacitive coupling and magnetic coupling between them become relatively strong. In addition, in the present example, the coil patterns 134 and 136 each have about three-turns, while the coil patterns 137 and 138 each have about four turns. Further, the coil patterns 134 and 136 each have relatively small outer and inner diameters, while the coil patterns 137 and 138 each have relatively large outer and inner diameters. The differences described above cause a differences in the degrees of the capacitive coupling and magnetic coupling generated between the coil patterns 134 and 136 and the capacitive coupling and magnetic coupling generated between the coil patterns 137 and 138, thereby allowing differential mode noise in different frequency bands to be attenuated.

Figure 17:
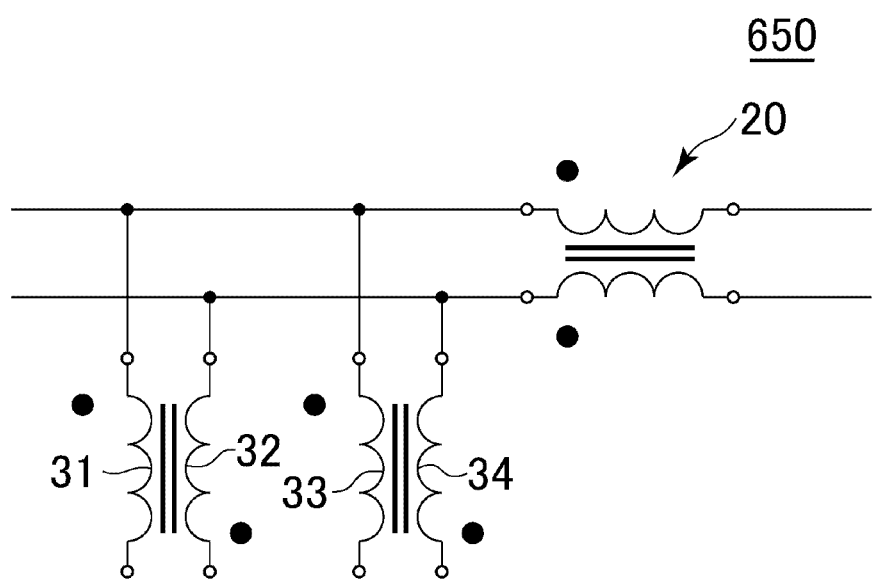
FIG. 17 is a circuit diagram of a common mode noise filter according to a modification of the sixth embodiment.

FIG. 17 is a circuit diagram of a common mode noise filter 650 according to a modification of the sixth embodiment. In the example of FIG. 17, the coils 31 and 32 and coils 33 and 34 are collectively connected to one side of the common mode filter 20. Even with such a configuration, the same characteristics as in the common mode noise filter 600 can be obtained.

Although the present invention has been described based on the preferred embodiments, the present invention is not limited to the above embodiments and various modifications may be made within the scope of the present invention. Accordingly, all such modifications are included in the present invention.

For example, the configuration of the common mode filter is not especially limited in the present invention, but any configuration may be adopted as long as the coils thereof are magnetically coupled in the same direction with respect to a pair of signal lines on which a differential signal is transmitted. Similarly, the configuration of the pair of capacitive coupled coils (differential mode filter) is not especially limited, but any configuration may be adopted as long as the one ends of the capacitive coupled coils are connected respectively to the corresponding signal lines and the other ends thereof are opened. Therefore, in place of using a planar spiral conductor as illustrated in FIG. 6, a three-dimensional helical conductor may be used. In the case where the three-dimensional helical conductor is used, a pair of helical conductors may be formed respectively in different wiring layer, or may be formed in the same wiring layer to achieve a double-helical structure.

Further, the planar shape of each coil pattern is not especially limited and may be formed into substantially a rectangular shape as illustrated in FIG. 6 or circular or ellipsoidal shape.

Further, a pair of coils constituting the differential mode filter need not always be magnetically coupled to each other as long as they are capacitively coupled. The presence/absence, degree, and direction of the magnetic coupling may be controlled based on the frequency band of the differential mode noise to be attenuated.

What is claimed is:

1. A common mode noise filter comprising:
a plurality of external terminals;
a common mode filter in a pair of signal lines; and
a pair of coils capacitively coupled to each other, each of the coils having one end connected to an associated one of the signal lines and the other end being free from connection with any of the plurality of external terminals so that the other end is opened.

2. The common mode noise filter as claimed in claim 1, wherein the pair of coils are formed in a single component, and the common mode filter and the pair of coils are formed respectively in different components.

3. The common mode noise filter as claimed in claim 1, wherein the common mode filter and the pair of coils are formed in a single component.

4. A common mode noise filter comprising:
a substrate;
a plurality of external terminals;
first and second coils magnetically coupled to each other and provided on the substrate; and
third and fourth coils capacitively coupled to each other and provided on the substrate, wherein
each of the first and second coils has one end paired with each other and connected to an associated one of the plurality of external terminals,
the third coil has one end connected to the one end of the first coil and the other end being free from connection with any of the plurality of external terminals so that the other end is opened, and
the fourth coil has one end connected to the one end of the second coil and the other end being free from connection with any of the plurality of external terminals so that the other end is opened.

5. The common mode noise filter as claimed in claim 4, wherein the third and fourth coils are magnetically coupled to each other.

6. The common mode noise filter as claimed in claim 5, wherein a winding direction from the one end of the third coil to the other end thereof as viewed from one direction is the same as a winding direction from the one end of the fourth coil to the other end thereof as viewed from the one direction.

7. The common mode noise filter as claimed in claim 5, wherein a winding direction from the one end of the third coil to the other end thereof as viewed from one direction is opposite to a winding direction from the one end of the fourth coil to the other end thereof as viewed from the one direction.

8. The common mode noise filter as claimed in claim 5, wherein each of the one ends of the third and fourth coils is one of an inner circumferential end and an outer circumferential end, and each of the other ends of the third and fourth coils is another one of the inner circumferential end and the outer circumferential end.

9. The common mode noise filter as claimed in claim 5, wherein each of the one end of the third coil and the other end of the fourth coil is one of an inner circumferential end and an outer circumferential end, and each of the other end of the third coil and the one end of the fourth coil is another one of the inner circumferential end and the outer circumferential end.

10. The common mode noise filter as claimed in claim 4, wherein the third and fourth coils overlap with each other as viewed in a direction perpendicular to a main surface of the substrate.

11. The common mode noise filter as claimed in claim 4, wherein the first and third coils are formed in a first wiring layer provided on the substrate, and the second and fourth coils are formed in a second wiring layer different from the first wiring layer provided on the substrate.

12. The common mode noise filter as claimed in claim 4, wherein the first to fourth coils are formed respectively in first to fourth wiring layers different from one another provided on the substrate.

13. The common mode noise filter as claimed in claim 4, further comprising fifth and sixth coils capacitively coupled to each other provided on the substrate, wherein the fifth coil has one end connected to one of the one end and the other end of the first coil and the other end opened, and the sixth coil has one end connected to one of the one end and the other end of the second coil and the other end opened.

14. A common mode noise filter comprising:
 a substrate;
 first and second coils magnetically coupled to each other provided on the substrate; and
 third and fourth coils capacitively and magnetically coupled to each other provided on the substrate, wherein
 each of the first and second coils has one end paired with each other,
 the third coil has one end connected to the one end of the first coil and the other end opened,
 the fourth coil has one end connected to the one end of the second coil and the other end opened, and
 each of the one ends of the third and fourth coils is one of an inner circumferential end and an outer circumferential end, and each of the other ends of the third and fourth coils is ether another one of the inner circumferential end and the outer circumferential end.

15. A common mode noise filter comprising:
 a plurality of external terminals including first to fourth external terminals;
 a first coil having a first end connected to the first external terminal and a second end connected to the second external terminal;
 a second coil having a third end connected to the third external terminal and a fourth end connected to the fourth external terminal;
 a third coil having a first inner circumferential end and a first outer circumferential end, one of the first inner circumferential end and the first outer circumferential end being connected to the first external terminal; and
 a fourth coil having a second inner circumferential end and a second outer circumferential end, one of the second inner circumferential end and the second outer circumferential end being connected to the third external terminal, wherein
 the other of the first inner circumferential end and the first outer circumferential end is connected to none of the plurality of external terminals, and the other of the second inner circumferential end and the second outer circumferential end is connected to none of the plurality of external terminals.

16. The common mode noise filter as claimed in claim 15, wherein the first and second coils are magnetically coupled to each other.

17. The common mode noise filter as claimed in claim 16, wherein the third and fourth coils are capacitively coupled to each other.

18. The common mode noise filter as claimed in claim 15, further comprising:
 a fifth coil having a third inner circumferential end and a third outer circumferential end, one of the third inner circumferential end and the third outer circumferential end being connected to the second external terminal; and
 a sixth coil having a fourth inner circumferential end and a fourth outer circumferential end, one of the fourth inner circumferential end and the fourth outer circumferential end being connected to the fourth external terminal.

19. The common mode noise filter as claimed in claim 18, wherein the other of the third inner circumferential end and the third outer circumferential end is connected to none of the plurality of external terminals, and the other of the fourth inner circumferential end and the fourth outer circumferential end is connected to none of the plurality of external terminals.

* * * * *